United States Patent [19]
Hui et al.

[11] Patent Number: 5,808,502
[45] Date of Patent: Sep. 15, 1998

[54] PARALLEL MICRO-RELAY BUS SWITCH FOR COMPUTER NETWORK COMMUNICATION WITH REDUCED CROSSTALK AND LOW ON-RESISTANCE USING CHARGE PUMPS

[75] Inventors: Alex Chi-Ming Hui, Los Altos; Yao Tung Yen, Cupertino; En-Ling Feng, Fremont; Daniel J. Dove, Applegate, all of Calif.

[73] Assignees: Hewlett-Packard Co.; Pericom Semiconductor Corp., both of San Jose, Calif.

[21] Appl. No.: 622,703

[22] Filed: Mar. 26, 1996

Related U.S. Application Data

[63] Continuation of Ser. No. 461,927, Jun. 5, 1995, abandoned.

[51] Int. Cl.$^6$ .................................................. H03L 5/00
[52] U.S. Cl. .......................... 327/333; 327/382; 327/407; 327/551
[58] Field of Search ........................... 327/108–112, 379, 327/382, 551, 333, 365, 384, 389, 407, 419, 427, 434; 326/30

[56] References Cited

U.S. PATENT DOCUMENTS

| | | | |
|---|---|---|---|
| 4,873,669 | 10/1989 | Furutani et al. | 365/230.03 |
| 5,289,062 | 2/1994 | Wyland | 327/389 |

OTHER PUBLICATIONS

C60 Solid–State Relay Datasheet, Teledyne Electronics, 1994.
Pp. 6–22, 11–14 et seq., Pericom Semiconductor Corp. DataBook 1994.

*Primary Examiner*—Kenneth B. Wells
*Attorney, Agent, or Firm*—Stuart T. Auvinen

[57] ABSTRACT

A micro-relay replaces electromechanical and solid-state opto-isolated relays in a computer network. The micro relay is an integrated circuit containing several bus switches in parallel. Each bus switch can make or break a connection. The bus switch is an n-channel MOS transistor with the source and drain connected to different network busses. A bus enable input causes the connection to be made or broken. The bus enable input is separately buffered for each gate of each MOS transistor to prevent crosstalk between bus switches. Since the MOS transistor stops conducting when the source is at a voltage level of the power-supply voltage minus the threshold voltage, a boosted voltage is applied to the gate of the MOS transistor to allow conduction even when the source is at the power-supply voltage level. The boosted voltage is generated by a charge pump. A substrate bias is applied to the transistors to prevent crosstalk from undershoots. Buffers for the gates of the bus switches are inverters that are connected to the boosted voltage rather than the power supply, and to the substrate voltage rather than ground. Thus the gates are driven to the boosted voltage or to the substrate voltage. For reduced crosstalk when the connection is broken, two transistors in series are used for each bus switch, with the intermediate node being pulled to ground when the bus switch is disabled, shielding the two transistors and the two network busses on opposite sides of the bus switch. An external capacitor is used to reduce noise from the charge pump.

20 Claims, 7 Drawing Sheets

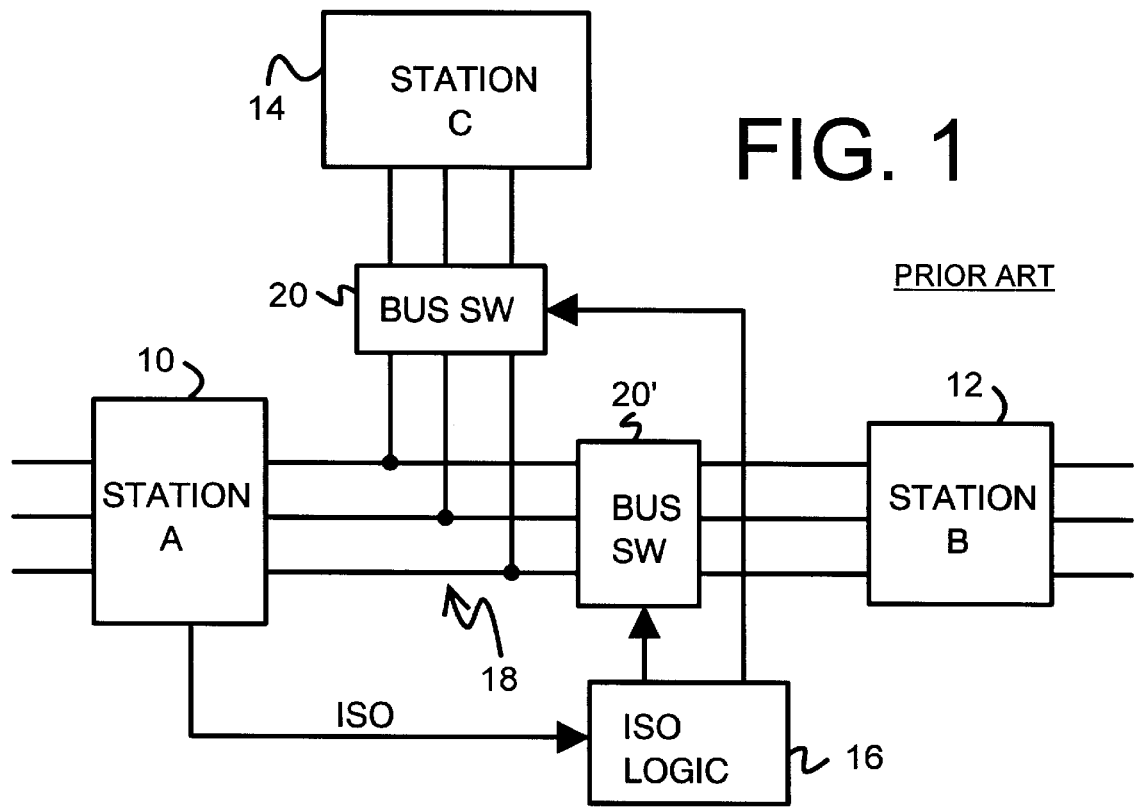
FIG. 1 PRIOR ART
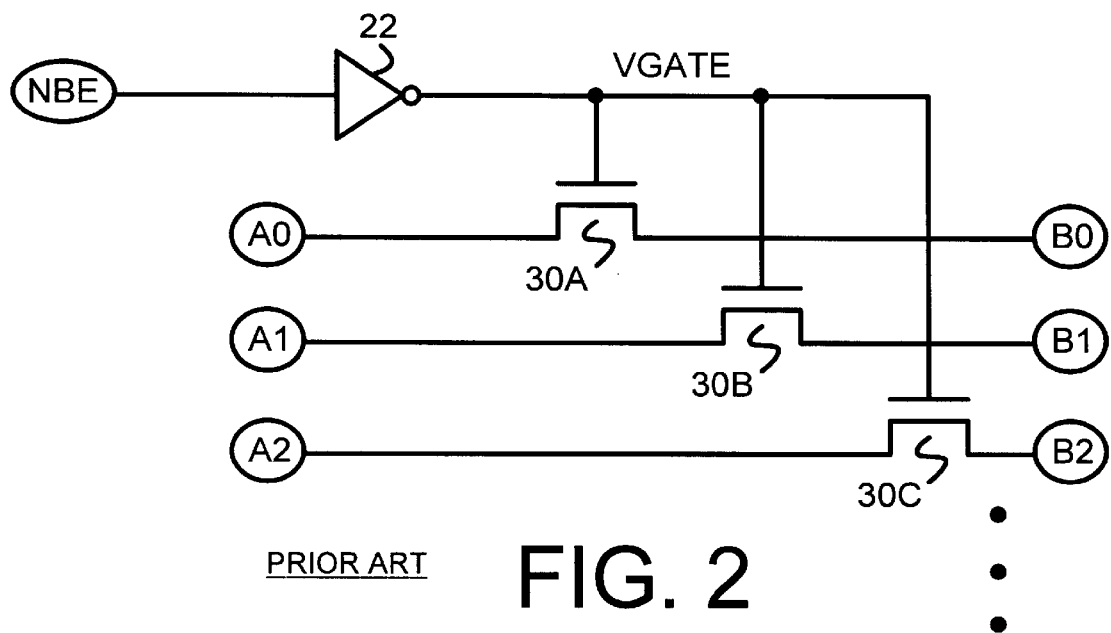
PRIOR ART FIG. 2

PARALLEL MICRO-RELAY BUS SWITCH FOR COMPUTER NETWORK COMMUNICATION WITH REDUCED CROSSTALK AND LOW ON-RESISTANCE USING CHARGE PUMPS

RELATED APPLICATION

This application is a continuation of Ser. No. 08/461,927 filed Jun. 5, 1995, now abandoned. This application is also related to Ser. No. 08/377,534, filed Jan. 23, 1995, for "Bus Switch with Low Noise", now abandoned.

BACKGROUND OF THE INVENTION—FIELD OF THE INVENTION

This invention relates to computer-network bus switches, and more particularly for a MOS-transistor-based bus switch using charge pumps and crosstalk isolation.

BACKGROUND OF THE INVENTION— DESCRIPTION OF THE RELATED ART

Communication systems connect computer users together. Networks allow users to share data and work cooperatively. At a physical level, these networks have cables that connect together these user's stations, and these cables are in turn connected together using relays or switches. Traditional electromechanical relays are being replaced by solid-state relays and bus switches.

Solid-state relays use opto-isolation to make or break a connection. A photo-sensitive diode makes a connection when exposed to light from a light-emitting diode (LED), but the photo-sensitive diode stops conducting and breaks the connection when the LED is turned off. While these solid-state relays are superior to electromechanical relays, solid-state relays are still relatively slow and bulky.

In this invention bus switches with certain features described as micro-relays are now being used in place of these relays. Bus switches are semiconductor integrated circuits (IC's) that use metal-oxide semiconductor (MOS) transistors to make or break the connection. Several switches may be combined on a single silicon die. One such single-silicon die device is made by the assignee of the present invention and marketed as the PI5C3861 Bus Switch. LEDs and photosensitive diodes are not needed. Table 1 compares features of electro-mechanical and solid-state relays to bus switches.

TABLE 1

Relay Comparison

| Feature | Electro-Mechanical Relay | Solid-State Relay | Bus Switch Micro-Relay |
|---|---|---|---|
| Package Size | Very Large | Small | Tiny |
| Functional Complexity | Primitive and Simple | Primitive and Simple | Complex and Sophisticated |
| Cost | High | High | Low |
| Typical Number of on/off operations until Failure | 10 Million | 15 Billion | >>15 Billion |
| Typical Switching Speed | 1 ms | 1 ms | 6 ns |
| Typical Switching Power | 10 W | low | low |
| Typical Switching Current | 1 Amp | 250 mA | 100 mA |
| Typical Switching Voltage | 200 V | 350 V | 5 V |
| Typical On Resistance | 50 mohm | 25 ohm | 5 ohm |
| Contact Bounce | Yes | No | No |
| EMI, RFI Noise Generation | Yes | Small | None |

TABLE 1-continued

Relay Comparison

| | | | |
|---|---|---|---|
| Shock Resistance | Limited | Resistant | Highly Resistant |

While bus switches have the advantages shown in Table 1, bus switches are not opto-isolated and may be subject to signal coupling and crosstalk. As networks push to higher and higher speeds, the great speed of these bus switches (about 100,000 times faster than solid-state relays) makes it desirable to use bus switches.

What is desired is an improved semiconductor bus switch with reduced coupling from input to output when the connection is broken. It is also desired to reduce susceptibility to undershoots on the inputs and to decrease the On-resistance, especially at input voltages approaching the power supply voltage. When several bus switches are packaged within the same IC, it is desired to reduce crosstalk between bus switches for different signals.

SUMMARY OF THE INVENTION

A micro-relay replaces electromechanical and solid-state opto-isolated relays in a computer network. The micro relay is an integrated circuit containing several bus switches in parallel. Each bus switch can make or break a connection. The bus switch is an n-channel MOS transistor with the source and drain connected to different network busses.

A bus enable input causes the connection to be made or broken. The bus enable input is separately buffered for each gate of each MOS transistor to prevent crosstalk between bus switches. Since the MOS transistor stops conducting when the source is at a voltage level of the power-supply voltage minus the threshold voltage, a boosted voltage is applied to the gate of the MOS transistor to allow conduction even when the source is at the power-supply voltage level. The boosted voltage is generated by a charge pump. A substrate bias is applied to the transistors to prevent crosstalk from undershoots.

For reduced crosstalk when the connection is broken, two transistors in series are used for each bus switch, with the intermediate node being pulled to ground when the bus switch is disabled, shielding the two transistors and the two network busses on opposite sides of the bus switch. An external capacitor is used to reduce noise from the charge pump.

In certain aspects the invention is a micro-relay containing parallel bus switches for connecting to networks. A power-supply input pin receives a power-supply voltage while a ground input pin receives a ground voltage. A bus enable pin receives a bus enable signal indicating when the parallel bus switches make or break a connection between a first network and a second network. A charge pump generates a boosted voltage greater than the power-supply voltage. The micro-relay has a plurality of bus switches, with each bus switch having a first bi-directional data pin for connecting to the first network and a second bi-directional data pin for connecting to the second network. A MOS transistor means has a source connected to the first bi-directional data pin and a drain connected to the second bi-directional data pin and a control gate. The control gate is for controlling the flow of current between the source and the drain. A buffer means responds to the bus enable signal and drives an enabling voltage onto the control gate of the MOS transistor means. The enabling voltage causes current to flow between the source and the drain when the bus enable signal indicates that the parallel bus switches make the connection, but the buffer means drives a disabling voltage onto the control gate when the bus enable signal indicates that the parallel bus switches break the connection. The disabling voltage prevents current flow between the source and the drain.

The buffer means for each bus switch separately buffers each control gate for each bus switch, preventing crosstalk between different bus switches through their control gates. The buffer means is coupled to the charge pump, and generates the enabling voltage as substantially equal to the boosted voltage from the charge pump. The MOS transistor means is able to conduct current whenever the source voltage is substantially between the around voltage and the power-supply voltage. Thus current is conducted by the bus switches when the source is substantially at the power-supply voltage and crosstalk between bus switches is reduced by separate buffer means for each bus switch.

Further aspects of the invention include a substrate bias voltage generator for generating a substrate voltage below the ground voltage. Thus the substrate voltage is applied to substrates of the MOS transistor means. The substrate bias voltage generator is also coupled to the buffer means, which outputs the disabling voltage substantially below the ground voltage at the substrate voltage. The substrate voltage is substantially one or more integral multiples of a transistor threshold voltage below the ground voltage.

BRIEF DESCRIPTION OF THE DRAWINGS

FIG. 1 is a diagram of a computer network.

FIG. 2 is a schematic of a simple micro-relay having three parallel bus switches.

DETAILED DESCRIPTION

Figure 3:
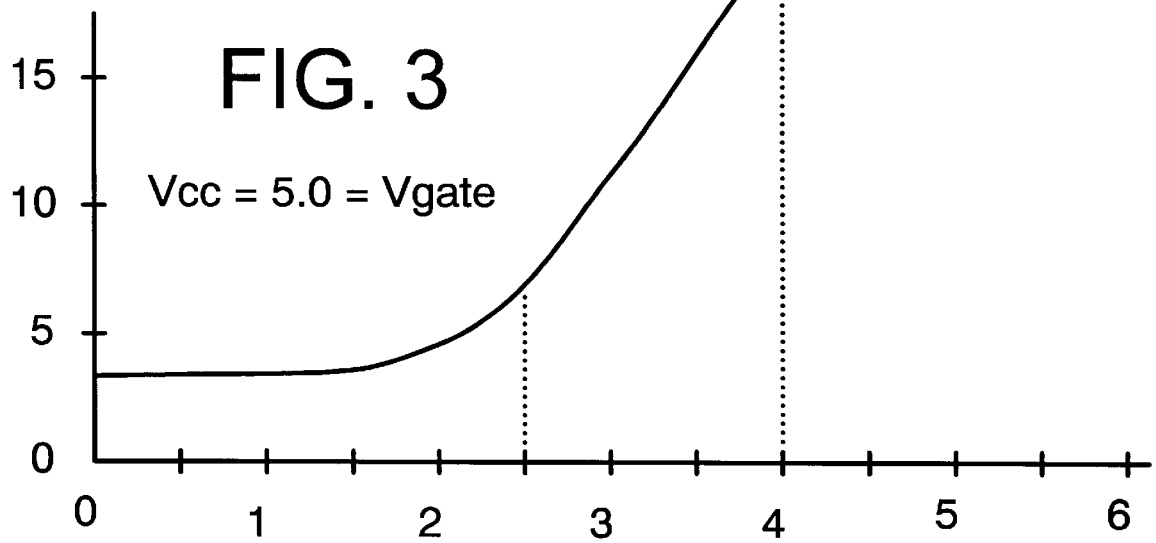
FIG. 3 is a plot of on-resistance as a function of input-signal voltage.

The present invention relates to an improvement in network bus switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Environment and Use of Invention—FIG. 1

FIG. 1 is a diagram of a computer network. Station 10 communicates with stations 12 14 over bus 18. Bus 18 may contain several wires, such as analog data and clock signals and a reference voltage such as ground. A bus conflict occurs if bus 18 is connected to both stations 12, 14 as each station could drive bus 18. Micro-relay bus switches 20 20' are provided to isolate bus 18 from stations 12, 14 under control of a bus enable signal from isolation logic 16. Station 10 can signal to logic 16 to connect bus 18 to station 12 by making the connection through bus switch 20', but breaking the connection through bus switch 20. Conversely, station 12 may be disconnected from station 10 and bus 18 while bus 18 is connected to station 14 by breaking the connection through bus switch 20', but making the connection through bus switch 20. This can be desirable when a fault occurs on station 12 and bus 18 must be disconnected from station 12 to avoid crashing the entire system including station 10. Both bus switches 20, 20' could break their connections when station 10 needs to be repaired or physically removed from the network.

In prior-art systems, bus switches 20, 20' are replaced by electromechanical or solid-state opto-isolated relays. Several bus switches may be combined into a single integrated circuit package. A micro-relay contains several bus switch MOS transistors in a single package. More than one bus enable signal may be provided to control the switches.

Simple Micro-Relay With Parallel Bus Switches—FIG. 2

FIG. 2 is a schematic of a simple micro-relay having three parallel bus switches. Inputs pins A0, A1, A2 connect an external cable from a network station to the drains of n-channel MOS transistors 30A, 30B, 30C. The sources of transistors 30A, 30B, 30C connect to outputs B0, B1, B2 which are pins on the micro-relay IC. Channel 0 connects pins A0 and B0 with transistor 30A while channel 1 connects pins A1 and B1 with transistor 30B. Likewise channel 2 connects pins A2 and B2 with transistor 30C. Each channel contains one bus switch that can make or break the connection between the pins.

Current is conducted in either direction between the sources and drains of transistors 30A, 30B, 30C and thus pins A0 and B0, A1 and B1, and A2 and B2 when the gates of these transistors are at least a threshold voltage above the source voltages. The gate voltage Vgate is generated by inverter 22, which is controlled by bus enable input NBE. When NBE is low, Vgate is driven to a high voltage, causing transistors 30A, 30B, 30C to conduct and make a connection between the A inputs and the B outputs. Since these n-channel transistors are inherently bi-directional, the source and drain terminals may reverse and current may flow from output to input rather than just from input to output.

The micro-relay also has inputs for power and ground, which are used to power inverter 22. Thus Vgate is driven to the power-supply voltage, Vdd or Vcc, or to ground, 0 volts. The power-supply voltage is typically 5.0 volts, although 3.0 or 3.3 volt-supplies are also commonly used.

The gate-to-source voltage has a direct relationship to the drain-to-source current through a MOS transistor. The On-resistance measures the voltage drop that develops from drain to source when a certain current flows from drain to source. Thus the On-resistance varies with the difference between the gate voltage Vgate and the source voltage.

On-Resistance Varies With Gate Voltage at Higher Signal Voltages

FIG. 3 is a plot of on-resistance as a function of input-signal voltage. When the bus enable input NBE is active (low), inverter 22 drives Vgate to Vcc, 5 volts. When the input and outputs are around ground, the on-resistance is low, about 5 ohms. However, when the input and outputs rise to a higher voltage, the on-resistance increases. This on-resistance is roughly constant up to about 2.5 volts. At 2.5 volts the on-resistance reaches a knee in the curve and increases more rapidly until it reaches infinite resistance at Vcc minus a n-channel threshold voltage, or about 4 volts. Thus the bus-switch has a distinct disadvantage when passing signals near Vcc.

While the bus switch has been effective when input signals are less than three volts, many systems have signals that can swing to Vcc. Even three-volt signals see a higher on-resistance as the curve's knee is passed at 2.5 volts. One solution is to simply connect the power supply input of the micro-relay chip to a voltage greater than 5 volts. For example, a 6.5-volt supply could be connected to the micro-relay. However, it is not always possible to generate an additional power-supply voltage since the entire network system may operate at a fixed power-supply voltage. Another solution is to internally boost the gate voltage Vgate.

Figure 4:
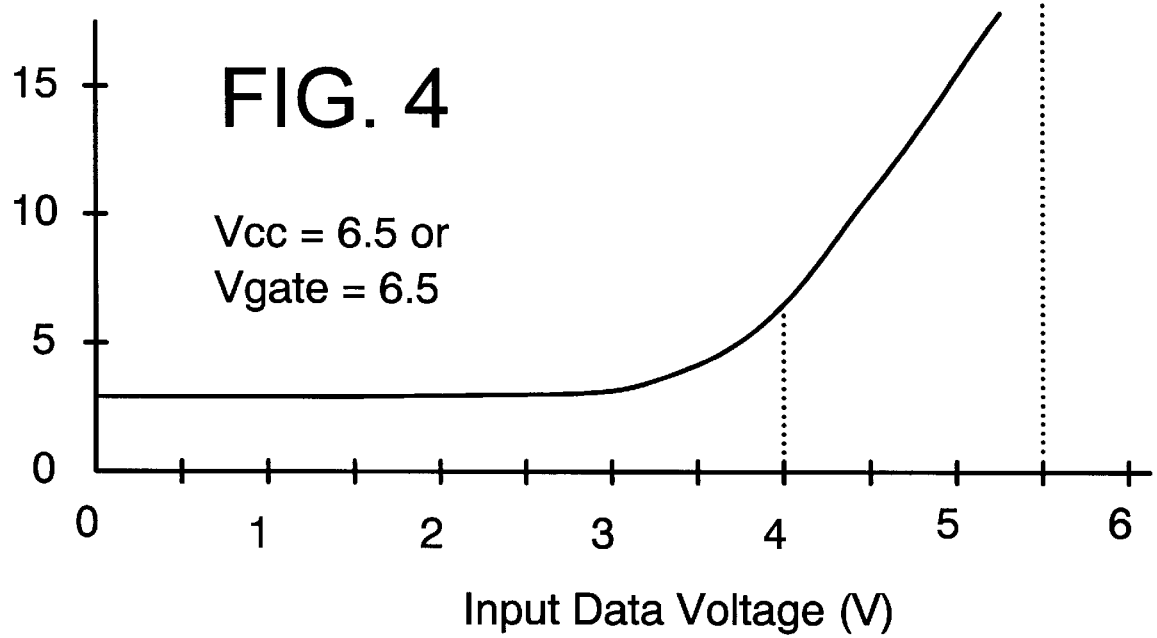
FIG. 4 is a plot of on-resistance as a function of input-signal voltage when Vcc or Vgate is boosted.

FIG. 4 is a plot of on-resistance as a function of input-signal voltage when Vcc or Vgate is boosted. When Vcc or Vgate is boosted from 5.0 volts to 6.5 volts, the curve's knee is raised from 2.5 to 4 volts. Infinite on-resistance is reached at about 5.5 volts instead of 4 volts. Thus input signals that swing from zero to five volts have a relatively constant on resistance up to about 4 volts, and the bus switch still conducts as inputs reach 5 volts.

Charge Pump Boosts Gate Voltage of Bus Switch

Figure 5:
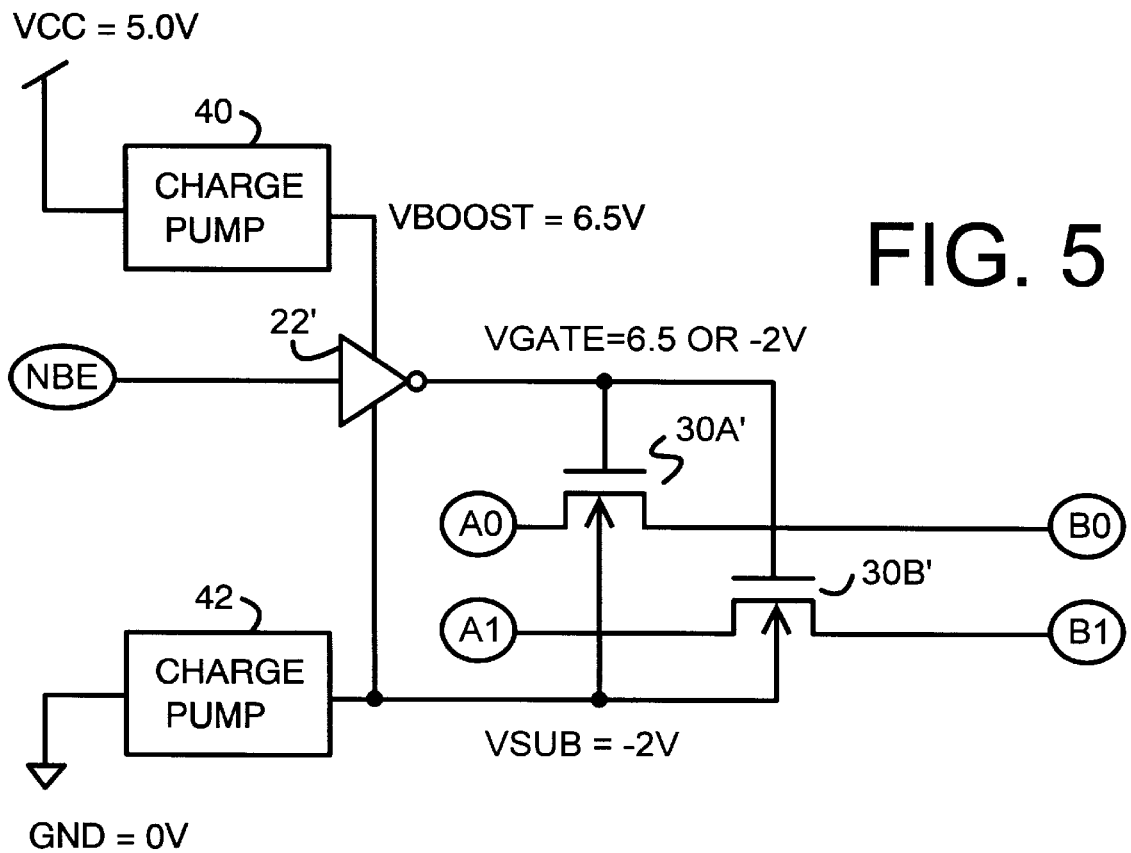
FIG. 5 shows two bus switches with a charge pump for internally boosting the gate voltage.

FIG. 5 shows a single bus switch with a charge pump for internally boosting the gate voltage. Inverter 22' drives Vgate to 6.5 volts rather than just to 5 volts when bus enable NBE is active (low). Charge pump 40 receives the power-supply voltage, 5 volts, and generates a boosted voltage Vboost of 6.5 volts. Vboost is connected to the p-channel transistor sources and wells in inverter 22' instead of connecting to them to Vcc. Thus the output Vgate of inverter 22' rises up to Vboost instead of to Vcc. Inverter 22' can be constructed from a CMOS inverter with a p-channel pull-up and an n-channel pull-down transistor, or a more complex arrangement of transistors may be used to construct inverter 22'.

FIG. 5 also shows a substrate or back-bias generator 42 that receives ground and generates a negative potential below ground. This negative potential is about 1–3 volts below ground and is designated Vsub as it is connected to the substrate terminal of n-channel transistors 30A', 30B'.

The substrate bias is needed to provide immunity against undershoot on the input or output pins A. B. Undershoot is common on network cabling and the bus switch must be able to withstand a certain amount of undershoot, such as 1–2 volts below ground. This undershoot forward biases the n+drain-p-substrate junctions which could initiate latch-up, seriously damaging the IC.

Gate Voltage Swings Negative to Vsubstrate to Turn Off Bus Switch

Vsub is also connected to the n-channel sources of inverter 22' so that inverter 22' drives Vgate to −1 to −3 volts instead of ground when bus enable NBE is inactive (high). Vgate must be driven below ground if a negative potential is applied to the substrate of transistors 30A', 30B'. Driving the gate Vgate of transistors 30A', 30B' to ground might not completely turn off transistors 30A', 30B' when a large negative back bias is applied, because the n-channel transistor 30A', 30B' is on at zero gate-to-source voltage. For small negative biases of just one volt the zero-volt gate bias is sufficient to disconnect the bus switch. However, more negative biases require that the gate be also biased below ground for disconnection. Thus when a large substrate bias is applied, the gate is driven below ground to disconnect the bus switch.

Typical Charge Pump Implementation

Figure 6:
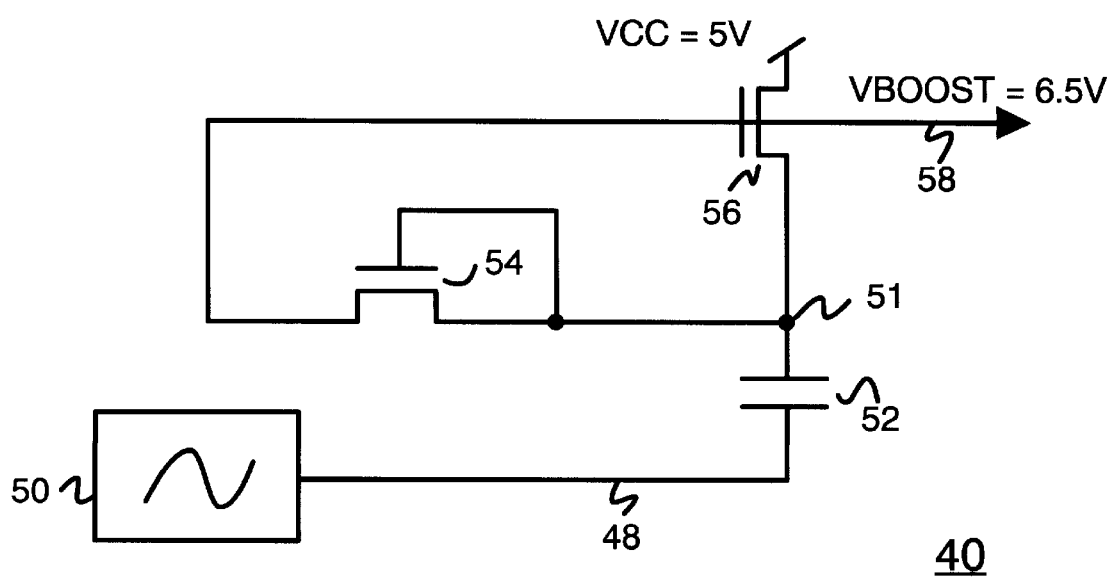
FIG. 6 shows a typical charge pump implemented in n-channel MOS.

FIG. 6 shows a typical charge pump implemented in n-channel CMOS. Charge pump 40 contains a multi-vibrator circuit 50 such as a simple ring oscillator that is applied to one side of capacitor 52. The other side of capacitor 52 is connected to diode circuit 54 that sucks charge from Vcc when the oscillator voltage 48 applied to capacitor 52 swings downward. When oscillator voltage 48 swings back up capacitor 52 pushes this charge on node 51 through an n-channel transistor connected as a diode 54 to boosted voltage node 58. The voltage of this boosted node 58 is one 'diode' voltage-drop above Vcc. The charge on node 51 is prevented from being pushed back to the Vcc node by another transistor 56 with its gate connected to boosted voltage node 58. Since the gate voltage of transistor 56 is about at the threshold above its source, any swing upward in the source voltage on node 51 shuts transistor 56 off. Thus transistor 56 acts as a diode or valve allowing charge to be drawn from Vcc but not be pushed back to Vcc.

Several charge pump circuits may be connected in series to achieve higher boosted voltages, with each stage increasing the voltage by a transistor threshold voltage. Since the body effect increases this threshold voltage, the charge pumps the voltage by about 1 to 1.5 volts rather than the nominal threshold of 0.5 to 0.7 volts without the body effect. Negative charge pumps that reduce a voltage below ground are also well-known and used as substrate bias generators. Many variations in charge pumps are known by those skilled in the art and may be used with the invention.

CROSSTALK REDUCTION IS CRUCIAL

Computer networks employ analog signals that often have both data and the clock encoded together into the same analog signal. Thus one wire or line can carry both data and a clock for synchronizing the data. This reduces the wiring needed and cost of a network. Unlike digital signals, these analog signals do not enjoy large noise margins. Noise introduced into these analog signals must be reduced. One noise source is other channels that share the same IC package when several bus switches are packaged together. Several mechanisms of crostalk have been identified by the inventors.

Crosstalk Noise Through Silicon Substrate

Noise may be coupled through the silicon substrate when one channel has an undershoot. This undershoot can temporarily alter the bulk voltage around another channel's bus switch transistor, possibly causing a change in current through the other channel's bus switch, or capacitivly coupling charge into the other channel at the source or drain of the transistor. For example, in FIG. 2 a voltage undershoot at pin A0 could inject charge into the substrate around bus switch transistor 30A for channel 0. This injected charge could travel through the bulk substrate to the vicinity of transistor 30B. This charge could temporarily alter the voltage of the bulk under transistor 30B, and thus change the source-to-bulk voltage and thus the current flowing through transistor 30B. The undershoot in channel 0 therefore alters channel 1.

Biasing the substrate with a negative bias, as shown for FIG. 5, increases the reverse-biased isolation from the input and output to the substrate. Thus an undershoot on one channel is less likely to generate enough charge to disrupt another channel. Proper layout, such as guard rings and increased spacing between transistors from different channels also reduces crosstalk between channels through the substrate.

Crosstalk Noise Through Common Gates

Another source of crosstalk between different channels occurs when the same inverter is used for several different channels. FIG. 5 shows that inverter 22' drives the gates of transistors 30A' and 30B' for both channels 0 and 1. Although the gates of MOS transistors are isolated from the substrate, sources, and drains by an insulating gate oxide, the gates are capacitivly coupled to the substrate, sources, and drains.

Rapid voltage changes in a source or drain can capacitivly couple a voltage into the gate of a MOS transistor. For example, a rapid voltage change in a source causes additional charge to be brought near the gate oxide. This additional source charge attracts an additional opposite charge in the gate of the MOS transistor. This additional charge attracted to the gate causes a transitory current to flow to the gate and can change the voltage of the node containing gate, and the voltage of any other gates sharing the same node as the capacitivly-coupled gate.

For FIG. 5. a rapid change in voltage at pin A0 could attract additional charge into the gate of transistor 30A'. This additional charge may initially be supplied by the gate of transistor 30B' of the other channel. Removing charge from the gate of transistor 30B' can also capacitivly couple a voltage change to the source of transistor 3OB' and thus into channel 1 at either pin A1 or pin B1. Thus the voltage change in channel 0 is coupled to channel 1. Crosstalk from channel 0 to channel 1 occurred because they shared the same node for their gates, even though their gates are 'isolated' from the source and drains of the channel.

Separate Enabling Drivers Provide Gate Isolation

Figure 7:
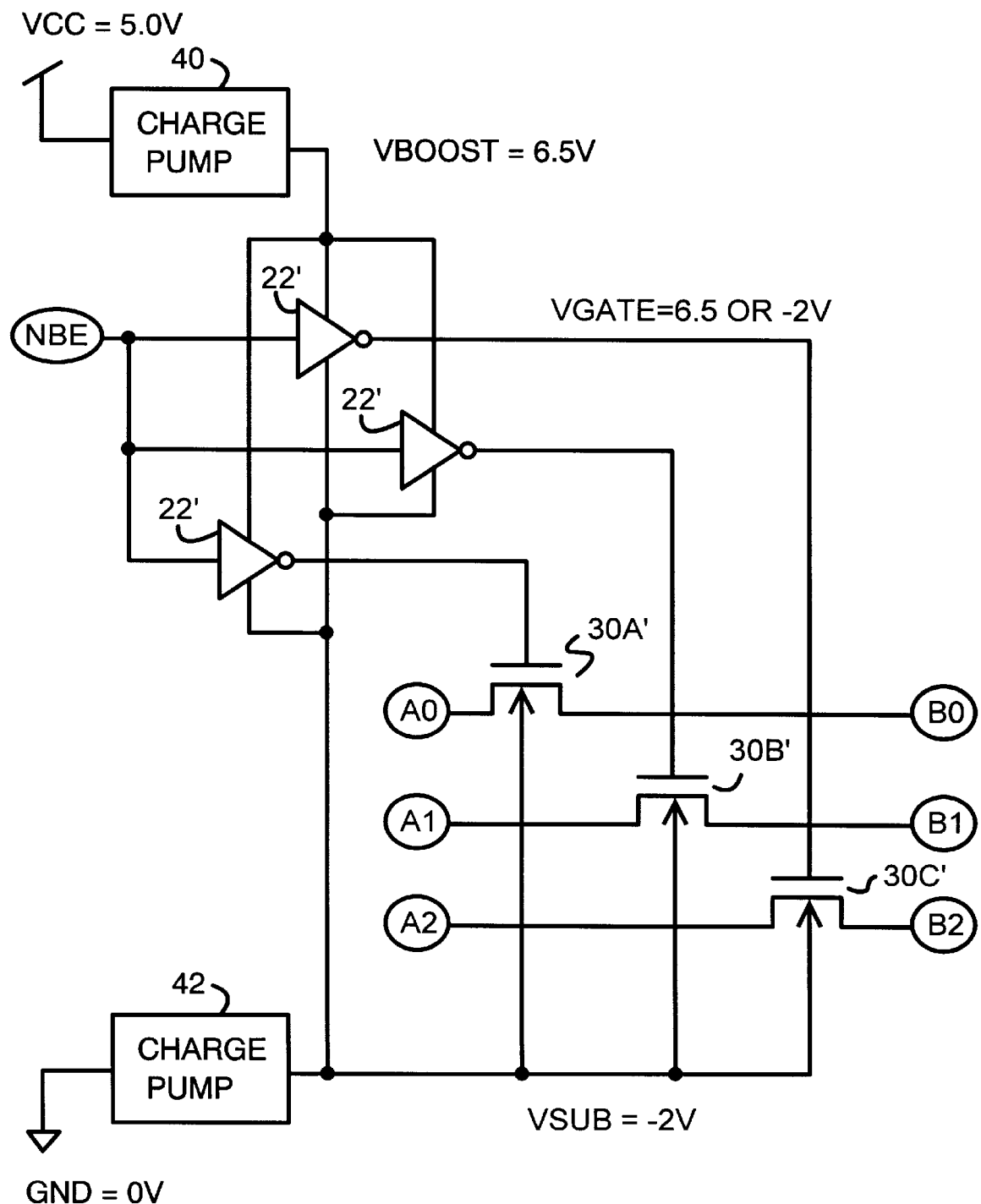
FIG. 7 is a micro-relay with three bus switches that isolate each transistor's gate using a separate, dedicated inverter for each gate.

FIG. 7 is a micro-relay with three bus switches that isolate each transistor's gate using a separate, dedicated inverter for each gate. The same reference numerals are used for similar objects in other figures. Three separate enabling inverters 22' are provided to drive the gates of transistors 30A', 30B', 30C' for the three separate channels 0, 1, 2. Since the gates of transistors from different channels no longer share the same electrical node, capacitive coupling to the gate of one channel cannot be coupled to the gate of another channel. Thus crosstalk is reduced.

Charges pumps 40, 42 supply Vboost and Vsub to each of the three inverters 22' instead of coupling these inverters 22' directly to Vcc and ground. Thus the gates are still driven to 6.5 volts to enable the channels, or to −2.0 volts to cut off the channels in response to the bus enable input NBE.

Crosstalk From Source to Drain Through Gate of Disabled Channel

Figure 8:
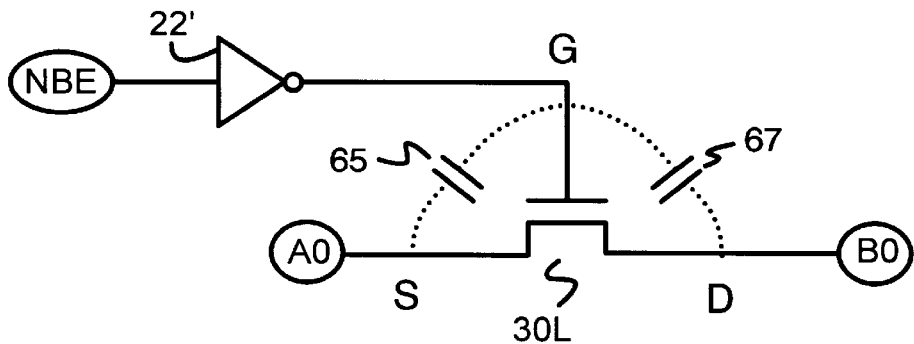
FIG. 8 highlights crosstalk in a single channel when the channel is disconnected.

FIG. 8 highlights crosstalk in a single channel when the channel is disconnected. Transistor 30 forms the bus switch between pins A0, B0 for channel 0. When bus enable NBE is high the bus switch is disabled and pins A0, B0 are disconnected from each other. It is important that no crosstalk occurs from A0 to B0 when disconnected, since A0 or B0 could be connected to analog signal lines for other stations in a network, as FIG. 1 showed for bus 18.

When bus enable NBE is high, inverter 22' drives a low voltage onto the gate of transistor 30, causing transistor 30 to be in the cutoff region of operation where no conducting channel is formed beneath the gate. Although no current flows from source S to drain D of transistor 30, capacitive coupling can still occur. MOS transistors have parasitic capacitances between their gates and their sources or drains. These parasitic capacitances result mostly from the gate overlapping a small portion of the source or drain diffusion region of the transistor.

Parasitic gate-source capacitor 65 capacitivly couples a rapid voltage change at the source, connected to pin A0, to the gate G, as generally described in the previous section. The charge attracted to gate G through capacitor 65 also attracts charge to the drain D through gate-drain capacitor 67. This attracted charge at drain D causes a slight voltage change at pin B0, even though transistor 30 is off and A0 and B0 should be disconnected. If pin B0 is connected to a computer network wire for an analog data and clock signal, then even this slight voltage change may cause data to be read or synchronized incorrectly, possibly crashing the network.

Two Transistors in Series With Grounded Connection Reduces Crosstalk

Figure 9:
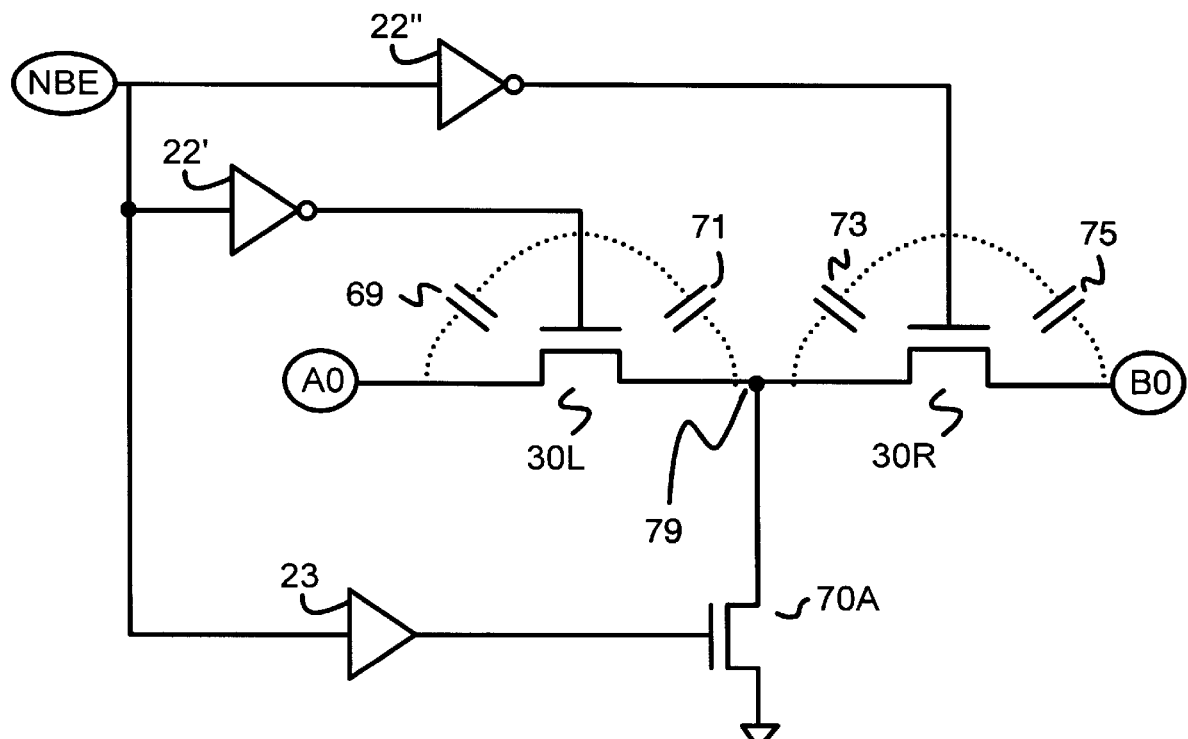
FIG. 9 shows an improvement where each bus switch has two transistors in series with separate inverters driving their gates and a grounded connecting node.

FIG. 9 shows an improvement where each bus switch has two transistors in series with separate inverters driving their gates and a grounded connecting node. The bus switch for channel 0 connecting pins A0, B0 now consists of two n-channel transistors 30L, 30R rather than just one n-channel transistor 30. Two separate inverters 22', 22" separately drive transistors 30L, 30R, preventing coupling through a common gate node. Inverter 22' drives the gate of transistor 30L, while inverter 22" drives the gate of transistor 30R. Both inverters 22', 22" are controlled by bus enable input NBE.

When bus enable NBE is high, indicating that the bus switch break the connection between pins A0, B0, then inverters 22', 22" drive a low voltage onto the gates of transistors 30L, 30R, putting these transistors in the cutoff region of operation. Although no conducting channel is formed under the gates of transistors 30L, 30R, parasitic capacitances between their gates and sources and drains exist. Although the two transistors 30L, 30R do not share a common gate node, they do share a common source or drain node, intermediate node 79. Capacitive coupling from A0 to B0 can now only occur through four parasitic capacitors— from A0 to intermediate node 79 through capacitors 69, 71, and from intermediate node 79 through capacitors 73, 75 to B0. This coupling through four parasitic capacitors 69, 71, 73, 75 is less likely to be significant than through the two parasitic capacitors 65, 67 of FIG. 8.

To absolutely prevent any coupling through intermediate node 79, transistor 70A connects intermediate node 79 to ground when bus enable signal NBE is inactive. Thus any charge coupled into intermediate node 79 is sinked to ground by transistor 70A. Transistor 70A may be placed near transistors 30L, 30R to effectively shield transistor 30L and its parasitic capacitors 69, 71 from transistor 30R and its parasitic capacitors 73, 75. Non-inverting buffer 23 isolates transistor 70A from enable signal NBE. Thus crosstalk in a single channel when disconnected is further reduced.

Figure 10:
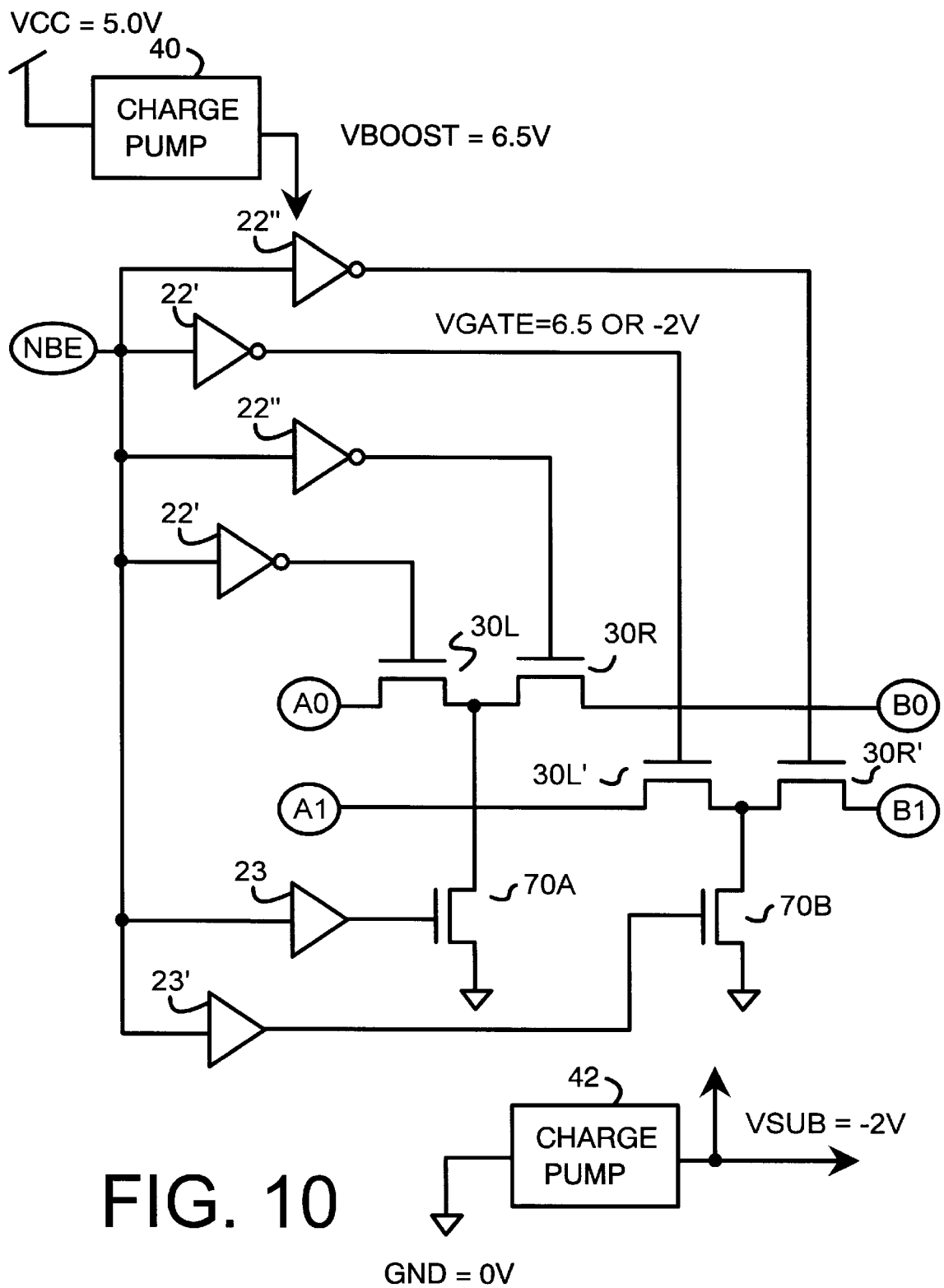
FIG. 10 shows two data channels each with two series bus switch transistors and separate enabling inverters for reduced crosstalk.

FIG. 10 shows two data channels each with two series bus switch transistors and separate enabling inverters for reduced crosstalk. Charge pumps 40, 42 generate Vboost, 6.5 volts, and Vsub, −2.0 volts, and are connected to the sources of transistors within each of the inverters 22', 22". Thus all gates for bus switch transistors 30L, 30R, 30L', 30R' are driven to 6.5 volts to make a connection between A0, A1 and B0, B1, or to −2.0 volts to break these connections. Charge pump 42 also provides Vsub to the P-well substrate for n-channel transistors, including bus switch transistors 30L, 30R, 30L', 30R'.

Transistors 70A, 70B are turned on when bus enable input NBE is high, indicating that the bus switches be disconnected. Transistor 70A shields transistor 30L from transistor 30R by driving the intermediate node between transistors 30L, 30R to ground, preventing crosstalk between A0, B0. Likewise, transistor 70B shields transistor 30L' from transistor 30R' by driving the intermediate node between transistors 30L', 30R' to ground, preventing crosstalk between pins A1, B1. Transistors 70A, 70B preferably have their substrate connection to ground rather than to Vsub, although buffers 23, 23' could drive the gates of transistors 70A, 70B to −2.0 volts to turn them off.

NOISE INTRODUCED BY CHARGE PUMP

Figure 11:
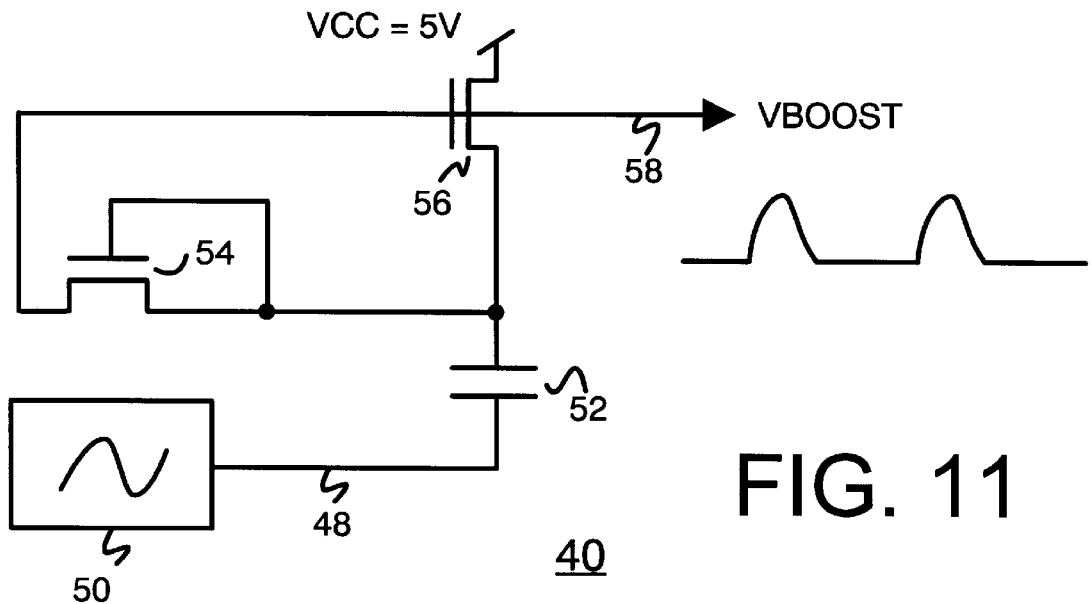
FIG. 11 shows a charge pump with a noisy boosted output voltage.

The charge pump itself may introduce noise into the data channels. Prior-art charge pumps that supplied boosted voltages or reduced substrate voltages to digital circuits could produce noisy pumped voltages since these digital circuits had wide noise margins. FIG. 11 shows a charge pump with a noisy boosted output voltage. Charge pump 40 was described in reference to FIG. 6 producing a pumped voltage on boosted node 58. As FIG. 11 shows, the pumped voltage on boosted node 58 contains ripples. These ripples are caused by the pumping action and have a frequency equal to that of multi-vibrator circuit 50. Each rising pulse from multi-vibrator circuit 50 charges Vboost above the power-supply voltage Vcc. However, as multi-vibrator circuit 50 reverses direction and begins a negative pulse, the diode connection of transistor 54 disconnects the multi-vibrator circuit 50 from the boosted node 58. Any current drawn from boosted node 58 causes the voltage to dip. Current is drawn from boosted node 58 by a variety of leakage sources and by transistor or gate switching. Thus boosted node 58 contains ripples as currents are drawn off and the voltage dips.

These ripples can introduce noise into the data channels such as through capacitive coupling from the substrate or gate to the sources and drains. Minimizing these ripples can minimize any noise introduced into the data channels, which may carry sensitive analog signals.

Figure 12:
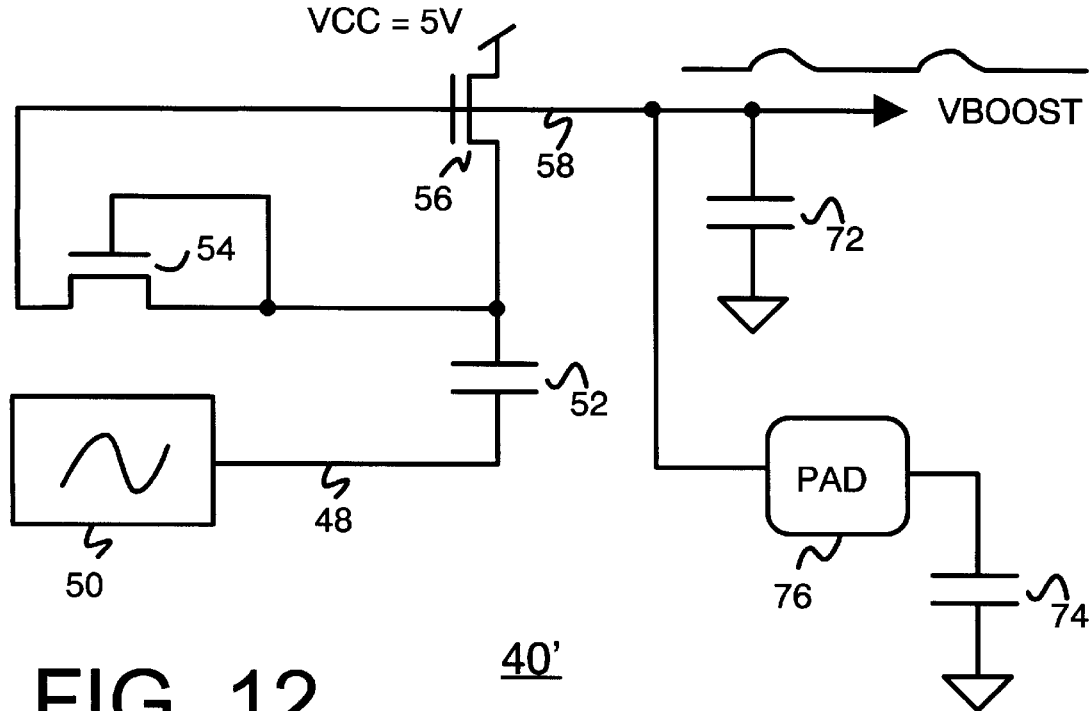
FIG. 12 is a diagram of a charge pump with reduced ripple and noise.

FIG. 12 is a diagram of a charge pump with reduced ripple and noise. Charge pump 40' is similar to that described for FIGS. 6 and 11, except that the ripple is reduced by adding capacitance to the boosted output node 58. Internal capacitor 72 smoothes out ripples generated by the pumping action of charge pump 40'. Internal capacitor 72 supplies transient current during negative pulses of multi-vibrator circuit 50, thus effectively reducing the charge withdrawn from boosted output node 58 and reducing voltage drops or ripples. Since it is difficult to fabricate large capacitors on an integrated circuit, an external capacitor 74 may be connected to boosted node 58 through pad 76. Pad 76 is a pin on the IC package and allows an end user to increase the capacitance of boosted node 58 by adding an external capacitor to his system. Thus the end user can reduce the noise generated by the charge pumps when the application demands less noise.

Two pads 76 could be provided on the IC package when both a charge pump to 6.5 volts and a substrate generator to −2 volts are used. However, the large capacitance of the substrate is sufficient to reduce ripple so that additional capacitors 72, 74 may not be needed for the substrate charge pump.

ADVANTAGES OF THE INVENTION

The external capacitor pin on the IC package is very flexible and cost-effective. The end user can decide how sensitive his application is and add external capacitance if necessary. The end user may also vary the external capacitance to determine the optimal capacitance for his application.

Prior-Art Power Switch Uses Charge Pumps But Little Noise Suppression

A prior-art power switch uses a MOS transistor with its gate voltage boosted above the power supply voltage by a charge pump. This power switch has an On-resistance of 0.2 ohm instead of 5 to 10 ohm for the micro-relay. While it may seem desirable to use the power switch in a network application, this is not effective since the extremely low On-resistance requires a MOS transistor about ten times larger than the bus switch transistor. Also two pins on the package are used in parallel for each input instead of just one pin. The net result is that just two power switches are contained in a single package instead of eight bus switches per package.

Power switching is less noise sensitive than bus switching since power supplies usually contain large capacitance and stay at a static voltage, while bus switching has as inputs signals that have lower capacitance and are constantly switching. Especially noise-sensitive are bus switches carrying an analog signal such as an ethernet data line which also has the clock encoded. Thus noise isolation and crosstalk protection are not used for power switch applications.

ALTERNATE EMBODIMENTS

Several other embodiments are contemplated by the inventors. While embodiments have been described having an active-low bus enable signal and enabling inverters driving gates of n-channel transistors, non-inverting or multi-stage enabling buffers may be used with active-high bus enable signals. Rather than using n-channel MOS transistors, other devices such as p-channel MOS transistors may be substituted by inverting signals as is well-known to those skilled in the art. A single IC package may be supplied with several bus enable inputs that may separately control different bus switches and channels, or these bus enable inputs may be combined together logically to generate a final bus enable signal.

The well-known body effect may extend the constant-resistance region to about 4.5 volts instead of just to 4.0 volts and likewise extend the infinite resistance point from 5.5 to 6.0 volts. This body effect increases the transistor threshold voltage when the substrate bias is large and a voltage difference occurs from source to bulk (substrate). Since the charge pump uses n-channel transistors whose sources are at high voltages, biasing their substrates more negative to ground increases their threshold voltage and increases the voltage boost. However, using a substrate bias of −2.0 volts also increases the source-to-bulk voltage and also increases the threshold voltage of the bus switch transistors, which may increase the on resistance and reduce the knee of the resistance curve.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A micro-relay with bus switches, the bus switches for connecting to networks, the micro-relay comprising:

a power-supply input pin for receiving a power-supply voltage;

a ground input pin for receiving a ground voltage;

a bus enable pin for receiving a bus enable signal indicating when the bus switches are to make or break a connection between a first network and a second network;

a charge pump for generating a boosted voltage greater than the power-supply voltage;

the plurality of the bus switches, each bus switch comprising:

a first bi-directional data pin for connecting to the first network;

a second bi-directional data pin for connecting to the second network;

a first and a second n-channel transistor in series, a source of the first n-channel transistor connected to the first bi-directional data pin and a drain of the second n-channel transistor connected to the second bi-directional data pin, wherein the first and the second n-channel transistor each have a control gate for controlling the flow of current between the source of the first n-channel transistor and the drain of the second n-channel transistor;

local buffer means, coupled to the bus enable pin, for driving an enabling voltage onto the control gate of the first n-channel transistor and the control gate of the second n-channel transistor, the enabling voltage causing current to flow between the source of the first n-channel transistor and the drain of the second n-channel transistor when the bus enable signal indicates that the bus switches are to make the connection, the local buffer means driving a disabling voltage onto each control gate when the bus enable signal indicates that the bus switches are to break the connection between the source and the drain, the disabling voltage preventing current from flowing between the source and the drain; and shielding means, coupled to an intermediate node between the first and second n-channel transistors, the shielding means also coupled to the bus enable signal, for coupling the intermediate node to a fixed voltage when the bus enable signal indicates that a connection between the first bi-directional data pin and the second bi-directional data pin be broken;

a substrate bias voltage generator for generating a substrate voltage below the ground voltage, wherein the substrate voltage is applied to substrates of the first and second n-channel transistors, wherein the substrate bias voltage generator is coupled to the local buffer means, the local buffer means outputting the disabling voltage substantially at the substrate voltage, wherein the boosted voltage is substantially one or more integral multiples of a transistor threshold voltage above the power-supply voltage;

wherein the local buffer means for each bus switch separately buffers each control gate for each bus switch, preventing crosstalk between different bus switches through their control gates;

wherein the local buffer means for each bus switch is coupled to the charge pump, the local buffer means generating the enabling voltage as substantially equal to the boosted voltage from the charge pump, the first and second n-channel transistors for conducting current when the voltages on the source terminals thereof are substantially between the ground voltage and the power-supply voltage, whereby current is conducted by the bus switches when the source is substantially at the power-supply voltage and whereby crosstalk between bus switches is reduced by separate local buffer means for each bus switch.

2. The micro-relay of claim 1 wherein the substrate bias voltage generator is coupled to the local buffer means, the local buffer means outputting the disabling voltage substantially below the ground voltage.

3. The micro-relay of claim 2 wherein the substrate voltage is substantially one or more integral multiples of a transistor threshold voltage below the ground voltage.

4. The micro-relay of claim 1 wherein an on-resistance between the first bi-directional data pin and the second bi-directional data pin is substantially between 5 and 10 ohms when the enabling voltage is driven onto the control gate of the first n-channel transistor and onto the control gate of the second n-channel transistor, the enabling voltage causing current to flow between the source and the drain.

5. A micro-relay with bus switches, the bus switches for connecting to networks, the micro-relay comprising:

a power-supply input pin for receiving a power-supply voltage;

a ground input pin for receiving a ground voltage;

a bus enable pin for receiving a bus enable signal indicating when the bus switches are to make or break a connection between a first network and a second network;

a charge pump for generating a boosted voltage above the power-supply voltage;

a plurality of the bus switches, each bus switch comprising:

a first bi-directional data pin for connecting to the first network;

a second bi-directional data pin for connecting to the second network;

a first MOS transistor, having a source connected to the first bi-directional data pin and a drain connected to an intermediate node, and a first gate, the first gate controlling the flow of current between the first bi-directional data pin and the intermediate node;

a second MOS transistor, having a source connected to the intermediate node and a drain connected to the second bi-directional data pin, and a second gate, the second gate controlling the flow of current between the second bi-directional data pin and the intermediate node;

shielding means, coupled to the intermediate node and to the bus enable signal, for coupling the intermediate node to a fixed voltage when the bus enable signal indicates that the connection between the first network and the second network be broken;

first buffer means, coupled to the bus enable signal, for driving an enabling voltage onto the first gate of the first MOS transistor, the enabling voltage causing current to flow when the bus enable signal indicates that the bus switches are to make the connection between the first network and the second network, the first buffer means driving a disabling voltage onto the first gate when the bus enable signal indicates that the bus switches are to break the connection between the first network and the second network, the disabling voltage preventing current from flowing; and second buffer means, coupled to the bus enable signal, for driving the enabling voltage onto the second gate of the second MOS transistor, the enabling voltage causing current to flow when the bus enable signal indicates that the bus switches are to make the connection between the first network and the second network, the second buffer means driving the disabling voltage onto the second gate when the bus enable signal indicates that the bus switches are to break the connection between the first network and the second network, the disabling voltage preventing current from flowing;

wherein the first and second buffer means for each bus switch separately buffer each first and second gate for each bus switch, preventing crosstalk between different bus switches through their gates and further preventing crosstalk from the first bi-directional data pin to the second bidirectional data pin when the disabling voltage is applied, whereby current is conducted by the bus switches when the first bi-directional data pin is substantially at the power-supply voltage and whereby crosstalk between bus switches is reduced by separate buffer means for each bus switch.

6. The micro-relay of claim 5 wherein the first and second buffer means are coupled to the charge pump, the first and second buffer means generating the enabling voltage as substantially equal to the boosted voltage from the charge pump, the first and second MOS transistors for conducting current when the voltages on the source terminals thereof are substantially between the ground voltage and the power-supply voltage including when the source voltages are equal to the power-supply voltage.

7. The micro-relay of claim 6 wherein an on-resistance between the first bi-directional data pin and the second bidirectional data pin is substantially between 5 and 10 ohms when the first and second MOS transistors conduct current.

8. The micro-relay of claim 7 further comprising:

a substrate bias voltage generator for generating a substrate voltage below the ground voltage;

wherein the substrate bias voltage generator is coupled to the first and second buffer means, the first and second buffer means outputting the disabling voltage substantially at the substrate voltage, and wherein the substrate voltage is applied to substrates of the first and second MOS transistor.

9. The micro-relay of claim 5 wherein the fixed voltage is the ground voltage and wherein the shielding means comprises an n-channel transistor controlling current flow between the intermediate node and the ground input pin.

10. The micro-relay of claim 8 wherein the first and second buffer means each comprise an inverter with a power connection thereof coupled to the boosted voltage and with a ground connection thereof coupled to the substrate voltage.

11. The micro-relay of claim 8 wherein the current flows from the first bi-directional data pin to the second bi-directional data pin or in a reverse direction from the second to the first bi-directional data pin.

12. The micro-relay of claim 8 wherein the first bi-directional data pin is connected to an analog signal, the analog signal including both data and a clock.

13. The micro-relay of claim 8 further comprising:

an external capacitor pad, connected to the charge pump, for connecting an external capacitor to the boosted voltage, the external capacitor not being on an integrated circuit containing the micro-relay, wherein pumping noise on the boosted voltage is reduced by the external capacitor.

14. A micro-relay with bus switches, the bus switches for connecting to networks, the micro-relay comprising:

a power-supply input pin for receiving a power-supply voltage;

a ground input pin for receiving a ground voltage;

a bus enable pin for receiving a bus enable signal indicating when the bus switches are to make or break a connection between a first network and a second network;

a plurality of the bus switches, each bus switch comprising:

a first bi-directional data pin for connecting to the first network;

a second bi-directional data pin for connecting to the second network;

a first and a second transistor in series, a source of the first transistor connected to the first bi-directional data pin and a drain of the second transistor connected to a second bi-directional data pin, wherein the first and the second transistor each have a control gate for controlling the flow of current between the source of the first transistor and the drain of the second transistor;

local buffer means, coupled to the bus enable pin, for driving an enabling voltage onto the control gate of the first transistor and the control gate of the second transistor, the enabling voltage causing current to flow between the source of the first transistor and the drain of the second transistor when the bus enable signal indicates that the bus switches are to make the connection, the local buffer means driving a disabling voltage onto each control gate when the bus enable signal indicates that the bus switches are to break the connection between the source and the drain, the disabling voltage preventing current from flowing between the source and the drain; and shielding means, coupled to an intermediate node between the first and second transistors, the shielding means also coupled to the bus enable signal, for coupling the intermediate node to a fixed voltage when the bus enable signal indicates that a connection between the first bi-directional data pin and the second bidirectional data pin be broken;

wherein the local buffer means for each bus switch separately buffers each control gate for each bus switch, preventing crosstalk between different bus switches through the control gates of the first and second n-channel transistors;

whereby crosstalk between bus switches is reduced by separate local buffer means for each bus switch.

15. The micro-relay of claim 14 wherein the first and second transistors are p-channel transistors.

16. The micro-relay of claim 14 wherein the first and second transistors are n-channel transistors.

17. The micro-relay of claim 16 further comprising:

a charge pump for generating a boosted voltage greater than the power-supply voltage;

wherein the local buffer means for each bus switch is coupled to the charge pump, the local buffer means generating the enabling voltage as substantially equal to the boosted voltage from the charge pump, the first and for conducting current when the voltages on the source terminals thereof are substantially between the ground voltage and the power-supply voltage.

18. The micro-relay of claim 17 further comprising:

a substrate bias voltage generator for generating a substrate voltage below the ground voltage;

wherein the substrate voltage is applied to substrates of the first and second transistors.

19. The micro-relay of claim 18 wherein the boosted voltage is substantially one or more integral multiples of a transistor threshold voltage above the power-supply voltage.

20. The micro-relay of claim 19 wherein an on-resistance between the first bi-directional data pin and the second bi-directional data pin is substantially between 5 and 10 ohms when the enabling voltage is driven onto the control gate of the first transistor and onto the control gate of the second transistor, the enabling voltage causing current to flow between the source and the drain.

* * * * *